US009875039B2

(12) United States Patent
Agrawal et al.

(10) Patent No.: US 9,875,039 B2
(45) Date of Patent: Jan. 23, 2018

(54) METHOD AND APPARATUS FOR WEAR-LEVELING NON-VOLATILE MEMORY

(71) Applicant: SanDisk Technologies Inc., Plano, TX (US)

(72) Inventors: Chetan Agrawal, Madhya Pradesh (IN); Dinesh Agarwal, Bangalore (IN); Vijay Sivasankaran, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 110 days.

(21) Appl. No.: 14/700,747

(22) Filed: Apr. 30, 2015

(65) Prior Publication Data
US 2016/0092122 A1    Mar. 31, 2016

(30) Foreign Application Priority Data
Sep. 30, 2014   (IN) ............................ 4925/CHE/2014

(51) Int. Cl.
*G06F 3/00*    (2006.01)
*G06F 3/06*    (2006.01)
*G06F 12/02*   (2006.01)
*G06F 12/06*   (2006.01)

(52) U.S. Cl.
CPC ............ *G06F 3/0616* (2013.01); *G06F 3/064* (2013.01); *G06F 3/0679* (2013.01); *G06F 3/0628* (2013.01); *G06F 3/0652* (2013.01); *G06F 3/0683* (2013.01); *G06F 12/0246* (2013.01); *G06F 12/0253* (2013.01); *G06F 12/0623* (2013.01)

(58) Field of Classification Search
CPC ...... G06F 3/0616; G06F 3/064; G06F 3/0679; G06F 3/0628; G06F 3/0652; G06F 3/0683; G06F 12/0246; G06F 12/0253; G06F 12/0623
USPC ........ 711/103, 154, 159, 165; 707/813, 820; 710/26, 34, 52, 55; 712/225, 245
See application file for complete search history.

(56) References Cited

U.S. PATENT DOCUMENTS

| | | |
|---|---|---|
| 6,973,531 B1 | 12/2005 | Chang et al. |
| 6,985,992 B1 | 1/2006 | Chang et al. |
| 7,096,313 B1 | 8/2006 | Chang et al. |
| 7,120,729 B2 | 10/2006 | Gonzalez et al. |
| 7,441,067 B2 | 10/2008 | Gorobets et al. |
| 7,552,272 B2 | 6/2009 | Gonzalez et al. |
| 7,752,382 B2 | 7/2010 | Lasser et al. |
| 7,925,822 B2 | 4/2011 | Mosek |
| 7,970,983 B2 | 6/2011 | Nochimowski |
| 8,069,302 B2 | 11/2011 | Lasser et al. |
| 8,788,778 B1 * | 7/2014 | Boyle ................. G06F 12/0253 711/155 |

(Continued)

OTHER PUBLICATIONS

Yongkun et al., 'Stochastic modeling and optimization of garbage collection algorithms in solid-state drive systems', Apr. 5, 2014, Springer Science + Business Media New York, pp. 115-148.*

*Primary Examiner* — Reba I Elmore
(74) *Attorney, Agent, or Firm* — Brinks Gilson & Lione

(57) ABSTRACT

Apparatus and method for performing wear leveling are disclosed. An ordered list of references to each of a set of memory blocks is stored. A set of memory blocks in the ordered list is sequentially allocating. The allocated set of memory blocks in the ordered list are erased in the sequence in which they were allocated.

19 Claims, 9 Drawing Sheets

(56) References Cited

U.S. PATENT DOCUMENTS

| | | | | |
|---|---|---|---|---|
| 8,904,090 B2* | 12/2014 | Baek | | G06F 12/0246 707/813 |
| 8,996,796 B1* | 3/2015 | Karamcheti | | G06F 12/121 711/103 |
| 9,037,779 B2 | 5/2015 | Dror et al. | | |
| 9,070,449 B2 | 6/2015 | Yang et al. | | |
| 9,208,070 B2 | 12/2015 | D'Abreu et al. | | |
| 9,298,608 B2 | 3/2016 | Fitzpatrick et al. | | |
| 9,329,797 B2 | 5/2016 | Darragh et al. | | |
| 9,423,970 B2 | 8/2016 | Darragh | | |
| 2010/0172180 A1* | 7/2010 | Paley | | G06F 12/0246 365/185.12 |
| 2011/0161563 A1* | 6/2011 | Chang | | G06F 12/0246 711/103 |
| 2012/0023273 A1* | 1/2012 | Myouga | | G06F 12/0253 710/52 |
| 2012/0254574 A1* | 10/2012 | Sinclair | | G11C 11/5628 711/165 |
| 2012/0297122 A1* | 11/2012 | Gorobets | | G06F 12/0246 711/103 |
| 2013/0024609 A1* | 1/2013 | Gorobets | | G06F 12/0246 711/103 |
| 2014/0006898 A1* | 1/2014 | Sharon | | H03M 13/356 714/755 |
| 2014/0019673 A1* | 1/2014 | Wakrat | | G06F 12/0246 711/103 |
| 2014/0136769 A1* | 5/2014 | Franceschini | | G06F 3/0601 711/103 |
| 2014/0181432 A1* | 6/2014 | Horn | | G06F 12/0253 711/159 |
| 2015/0026390 A1* | 1/2015 | Li | | G06F 12/0246 711/103 |
| 2015/0134887 A1* | 5/2015 | Liang | | G06F 12/0246 711/103 |

\* cited by examiner

METHOD AND APPARATUS FOR WEAR-LEVELING NON-VOLATILE MEMORY

REFERENCE TO RELATED APPLICATION

This application claims the benefit of Indian Application No. 4925/CHE/2014, filed on Sep. 30, 2014, which is hereby incorporated by reference in its entirety.

TECHNICAL FIELD

This application relates generally to managing data in a memory system. More specifically, this application relates to relocating data from one memory block to another memory block in a solid state storage device.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Non-volatile memory systems, such as flash memory, are used in digital computing systems as a means to store data and have been widely adopted for use in consumer products. Flash memory may be found in different forms, for example in the form of a portable memory card that can be carried between host devices or as a solid state disk (SSD) embedded in a host device. These memory systems typically work with memory units called memory chunks, pages and memory blocks.

For efficient functioning of non-volatile memory systems, it is often desirable to relocate data stored in one memory unit to another memory unit.

SUMMARY

In one aspect, a method for selecting blocks in a memory of a memory device for release is disclosed. The method, using a processor, includes: receiving host data from the host; in response to receiving the host data, storing the host data in the blocks of the memory in a sequence; determining to release one or more blocks in the memory; in response to determining to release one or more blocks, selecting blocks for release based, at least in part, on the sequence in which the host data was stored in the blocks; and performing block release on the selected blocks.

According to another aspect, a method for selecting blocks in a memory of a memory device for unallocation is disclosed. The method, using a processor, includes: determining to store data in one or more unallocated blocks of memory; accessing a free block FIFO, the free block FIFO comprising a series of references indicative of series of unallocated memory blocks; selecting unallocated blocks in which to store the data based on the series of references in the free block FIFO; determining to unallocate one or more allocated blocks of memory; accessing a closed block FIFO, the closed block FIFO comprising a series of references indicative of series of allocated memory blocks; selecting allocated blocks for an unallocation process based on the series of references in the closed block FIFO; and performing the unallocation process on the selected allocated blocks in order to unallocate the selected allocated blocks.

According to yet another aspect, a storage device is disclosed. The storage module includes: a memory comprising blocks; a storage module configured to store data in the blocks of the memory in a sequence; a release determination module configured to determine whether to release one or more blocks in the memory; a block selection module configured to, in response to determining to release one or more blocks, select blocks for release based, at least in part, on the sequence in which the data was stored in the blocks; and a release module configured to release the selected blocks.

DETAILED DESCRIPTION

Figure 1:
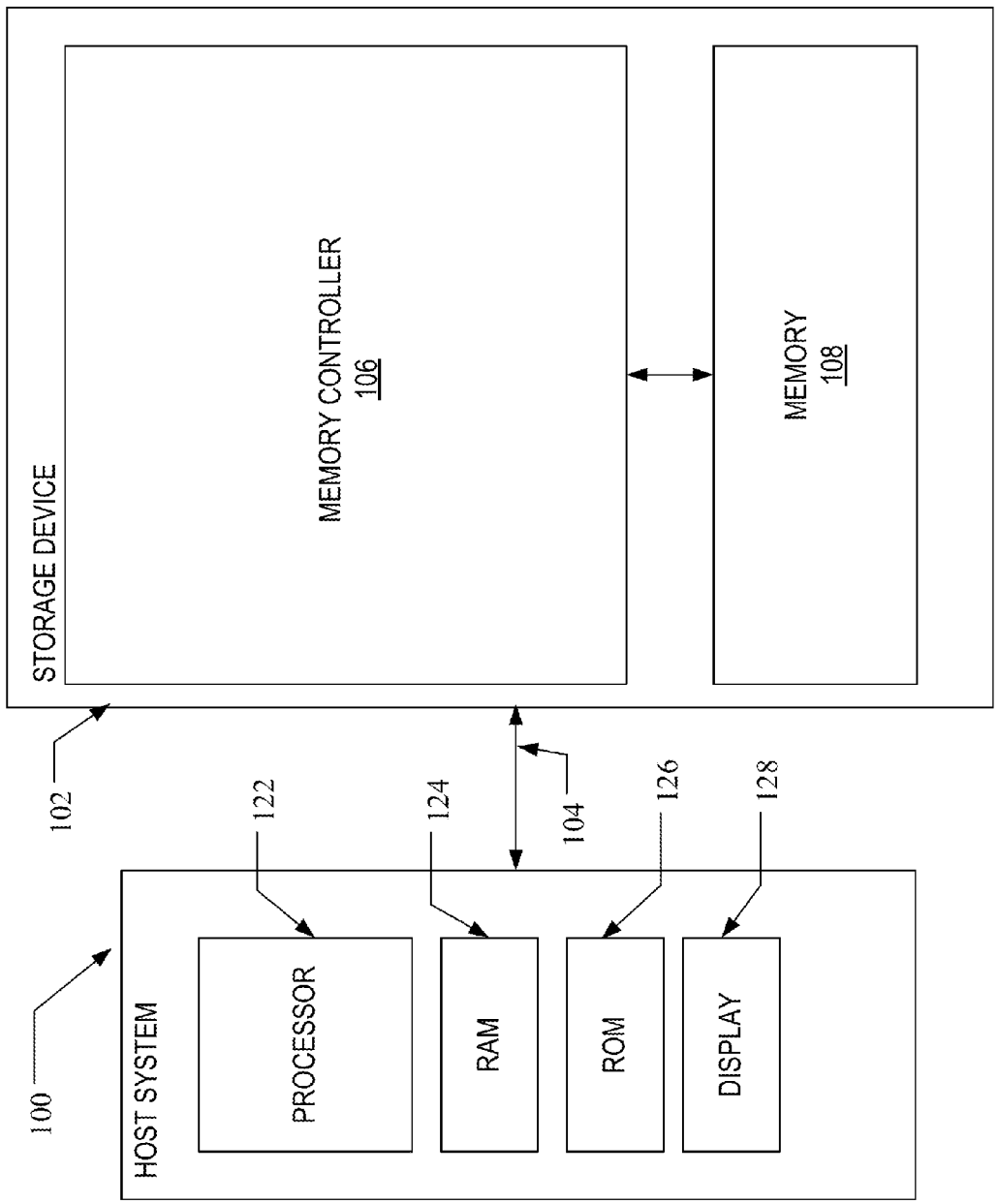
FIG. 1 illustrates a block diagram of host system and storage device according to one embodiment.

A system suitable for use in implementing aspects of the invention is shown in FIG. 1. A host system 100 stores data into, and retrieves data from, a storage device 102. The storage device 102 may be referred to as a memory system. The storage device 102 may be embedded in the host system 100 or may exist in the form of a card or other removable drive, such as a solid state disk (SSD) that is removably connected to the host system 100 through a mechanical and electrical connector conforming to an appropriate standard such as e-MMC, PCMCIA, CompactFlash or other known connector formats. The host system 100 may be any of a number of fixed or portable data generating devices, such as a personal computer, a mobile telephone, a personal digital assistant (PDA), or the like. The host system 100 communicates with the storage device over an input/output interface 104.

In an embodiment, the storage device 102 comprises a memory controller 106 and a memory 108. Memory 108 may include semiconductor memory devices that store data. In an exemplary embodiment, methods implemented by the memory controller 106 may relocate data stored in the memory 108. The storage device 102 may be in the form of a portable flash drive, an integrated solid state drive or any of a number of known flash drive formats. In yet other embodiments, the storage device 102 may include only a single type of flash memory having one or more partitions.

Memory controller 106 operates to communicate data and program code back and forth between host system 100 and memory 108. The memory controller 106 may convert between logical addresses of data used by the host system 100 and physical addresses of memory 108 during programming and reading of data.

As discussed in more detail below, the storage device 102 may include functions for memory management. In operation, a processor, such as one discussed below with respect to FIG. 2, may execute memory management instructions for operation of memory management functions. The memory management functions may control the assignment of the one or more portions of the memory 108 within storage device 102. In a preferred embodiment, memory management functions also include relocating stored data between different portions of memory 108.

In this regard, the storage device 102 may perform one or more operations on the blocks in memory 108. The operations may be triggered by an external device, such as the host system 100. For example, the operations may be performed in response to communication with the host system 100, such as a request from the host system 100 to write data to the memory 108 of the storage device. Alternatively, the operations may be triggered internally by the storage device. For example, the operations may be performed in response to a determination by the memory controller 106 of the storage device to perform the operations. More specifically, the memory controller 106 may determine to perform an internal write to one or more blocks in memory 108.

In one embodiment of the invention, the controller 106 tracks the sequence in which blocks in the memory 108 are used to perform one or more operations (such as write of data from the host system 100), and repeats the sequence in which the blocks are used when performing the one or more operations in the future. For example, in response to a request from the host system 100 to write data to the memory 108, the controller 106 may store the data into blocks in memory 108 (such as in SLC memory blocks 208-1, etc.). The controller 106 may track the specific sequence in which the blocks in memory are used (such as the specific sequence in which the SLC memory blocks are filled with data from the host). The controller 106 may then repeat the specific sequence in which the blocks of memory are used when performing the operation in the future. For example, the controller may cycle through the blocks in SLC memory in a same sequence when writing data from the host.

As discussed in more detail below, the controller 106 may track the specific sequence in which the blocks of memory are used by employing one or more first-in-first-out (FIFO) arrays. For example, the controller 106 may use a first array to list which blocks are available for a certain operation (or a certain set of operations), and may use a second buffer to list the sequence in which the blocks that have been used to perform the certain operation (or certain set of operations). In a more specific example in which the operation is writing host data, the controller may use a free block FIFO to list which blocks are available for writing host data to, and may use a closed block FIFO to list the sequence in which the closed blocks have had host data written to it.

For example, the memory 108 may be divided into 60 blocks, with 50 blocks being assigned for use to store host data and 10 blocks being assigned for use to store internal writes (such as control data). After initially formatting the memory 108, all 50 blocks assigned to store host data are available for writing host data to. In this regard, the free block FIFO lists all of the 50 blocks in a sequence. One example of an initial sequence is block 1, block 2, block 3, . . . , block 50. So that, the head for the free block FIFO is pointed to block 1 and the tail for the free block FIFO is pointed to the next block after block 50. Similarly, since none of the 50 blocks assigned to store host data have host data written therein, the closed block FIFO is empty.

Subsequently, the storage device 102 may receive data from host system 100 for write in memory 108. For example, the host system may send data to write in 10 blocks. The free block FIFO indicates the sequence in which blocks are written (as determined by the head of the free block FIFO). More specifically, with the head of the free block FIFO, pointing to block 1, the controller 106 selects 10 blocks for writing (block 1, block 2, block 3, block 4, block 5, block 6, block 7, block 8, block 9, block 10) the host data. Further, the controller modifies the closed block FIFO based on the write. More specifically, the head of the closed block FIFO points to block 1 (as the first block written with the host data) and the tail of the closed block FIFO points to block 10 (as the last block written with the host data).

The controller 106 of the storage device 102 continues to select blocks for write based on the head of the free block FIFO, and updates the tail of the closed block FIFO with the written blocks. In the event the controller 106 determines that there is an insufficient number of free blocks, as illustrated by the number of blocks between the head and the tail of the free block FIFO, the controller may perform one or more operations in order to create additional free blocks, thereby releasing the blocks. Examples of operations to create additional free blocks or to release the blocks include garbage collection and folding.

Garbage collection may be a consolidation or aggregation of valid data from blocks that have a mixture valid data and obsolete data that results in more free blocks since there are fewer blocks that have a mixture of both valid and obsolete data. More specifically, memory systems, such as storage device 102, may operate in a logical address space. One drawback of operating in the logical address space is fragmentation. Data written by a host file system of the host device 100 may often be fragmented in logical address space, where many fixed logical groups are only partially updated with new data. The fragmentation may occur as a result of cumulative fragmentation of free space by the host file system, and possibly even as a result of inherent fragmentation of individual files by the host file system. Data previously written may become obsolete due to deletion and cause further fragmentation. Garbage collection may thus be needed to aggregate obsolete data together in blocks to be erased. One example of a garbage collection operation is illustrated in U.S. Published Application No. 2013/0166818 A1, incorporated by reference herein in its entirety.

As discussed in more detail below, in operation, blocks that are designated as closed (and are included in the closed block FIFO) may be selected for release (e.g., garbage collection). The blocks selected for garbage collection are selected based on the sequence, as listed in the closed block FIFO beginning with the head of the closed block FIFO. As discussed above, the selected blocks may be filled with valid data, may be filled with obsolete data, or may include both valid and obsolete data. In the instance where a selected respective block is filled with valid data (i.e., there is no obsolete data in selected respective block), the entire contents of the selected respective block are written into a free block, and the selected respective block is erased (with a designation to the selected respective block being added to the tail of the free block FIFO). In the instance where a selected respective block is filled with obsolete data (i.e., there is no valid data in selected respective block), the selected respective block may simply be erased (with a designation to the selected respective block being added to the tail of the free block FIFO) without copying any of the obsolete data into a free block. In the instance where a selected respective block is filled with both valid and obsolete data, only the valid data in the selected respective block is written into a free block, and the selected respective block is erased (with a designation to the selected respective block being added to the tail of the free block FIFO). In this regard, garbage collected blocks that are entirely or partially filled with obsolete data results in freeing of additional space.

Figure 2:
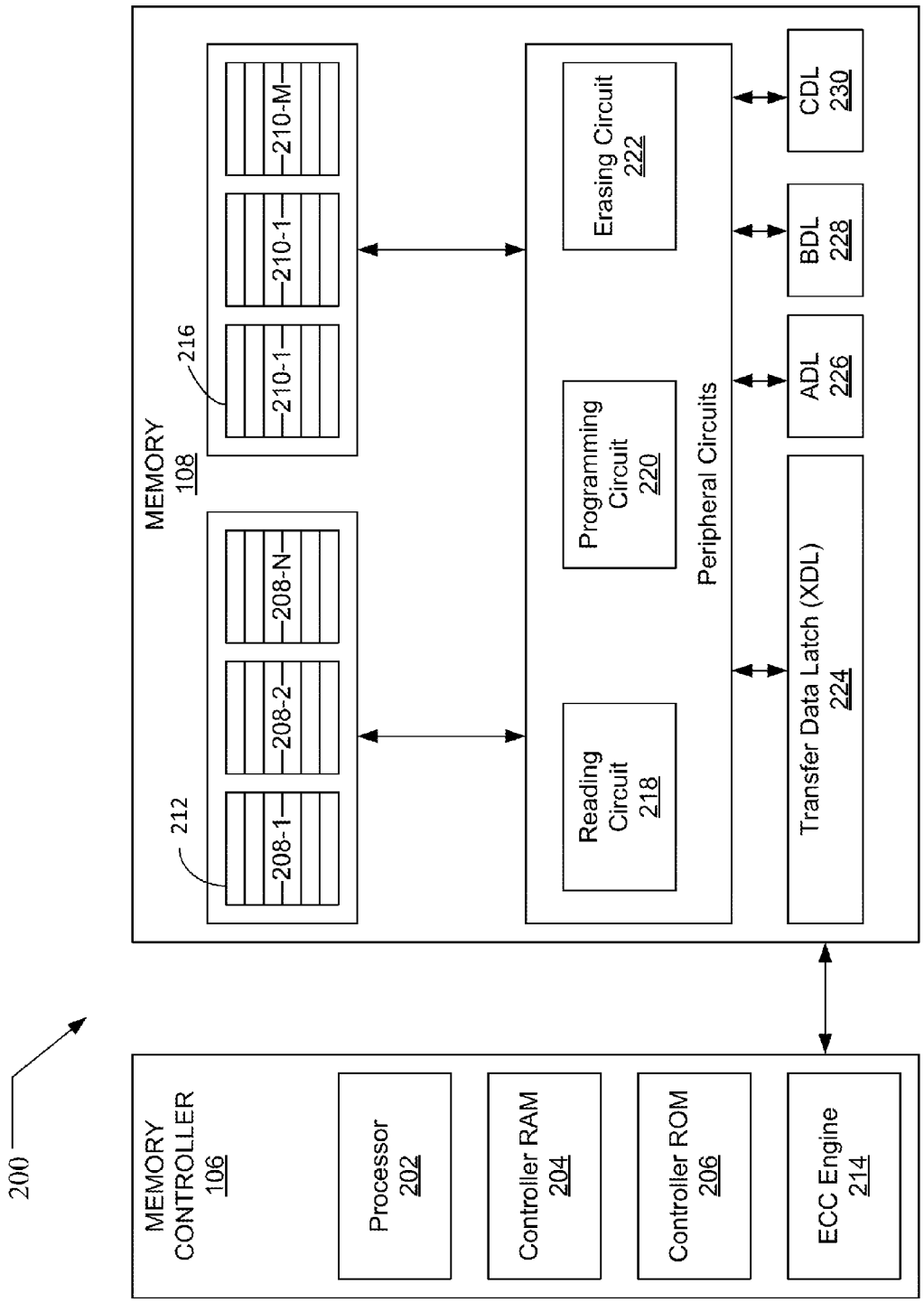
FIG. 2 is a block diagram of an example memory system/storage device that may implement methods described herein.

FIG. 2 is a detailed block diagram of an example memory system 200. In this embodiment, the example memory system 200 corresponds to the storage device 102 of FIG. 1. The memory system 102 comprises a memory controller 106 and memory 108. The memory controller 106 includes a processor 202, controller RAM 204, controller ROM 206 and error correcting code (ECC) engine 214, in this embodiment. The processor 202 may comprise a microprocessor, a microcontroller, an application specific integrated circuit (ASIC), a field programmable gate array, a logical digital circuit, or other now known or later developed logical processing capability. Controller ROM 206 may store software instructions that processor 202 may execute to control the operation of memory system 200 and perform the data relocation methods described herein.

Memory 108 may correspond to any solid state non-volatile memory. Non-volatile memory retains information stored therein even if the storage device 102 is powered down or disconnected from host system 100. In an embodiment, memory 108 corresponds to NAND flash memory. In this embodiment, memory 108 is organized as memory pages. A memory page is the smallest writing unit of a NAND flash memory. Typically a memory page may store from 4 to 16 Kilobytes of data. A memory pages comprises single-level cells (SLC) or multi-level cells (MLC). An SLC stores a single bit of data per cell. An MLC memory stores multiple bits of data per cell. For example, a two-level MLC stores 2 bits of data per cell, a three-level MLC stores 3 bits of data per cell and N-level MLC stores N bits of data per cell.

Both types of cells (SLC and MLC) store data by storing electric charge (charge). The amount of charge stored in a cell is representative of the data bit(s) stored in the cell. For example, where no charge is stored in an SLC, the charge value represents a bit value of 0. In contrast, a predefined amount of charge stored in an SLC, represents the bit value of 1. In the case of an N-level MLC, different amounts of charge may be stored to represent anyone of the $2^N$ bits of data. For example, a two-level MLC is configured to store any one of four amounts of charge ($2^2$=4).

In an embodiment, in response to receiving a request for a read, the reading circuit 218 of FIG. 2 translates the amount of charge stored in a memory cell to a binary representation of the data corresponding to the amount of charge stored in the cell. Programming circuit 220 translates data to a charge level and causes the corresponding charge to be stored in a memory cell.

Memory pages may be grouped together to form a physical memory block. In one embodiment, a memory block is the smallest erasing unit. Data is written on a memory page by memory page basis. In one embodiment, erasing a memory page of a memory block requires erasure of all the memory pages of the memory block. As discussed in more detail below, prior to erasing the memory block, all current valid data from the other memory pages of the memory block are moved to erased memory pages of another memory block. A memory block consisting of SLC type pages may be referred to as an SLC memory block. A memory block consisting of MLC type pages may be referred to as an MLC memory block. For example, sixteen 16 Kbytes SLC memory pages may be grouped to create a 256 Kilobytes memory block.

Referring to FIG. 2, in an exemplary embodiment, memory 108 comprises N number of SLC memory blocks, 208-1 to 208-N and M number of 3-level MLC memory blocks, 210-1 to 201-M. Each row in a memory block represents a memory page. For example, memory page 212 is an SLC memory page that is a part of memory block 208-1 and memory page 216 is an MLC memory page that is a part of memory block 210-1. In this embodiment, a single 3-level MLC memory page may store three times the amount of data that may be stored in an SLC memory page.

Memory 108 also includes a programming circuit 220, a reading circuit 218, a retouching circuit 222, transfer data latch (XDL) 224, data latch A (ADL) 226, data latch B (BDL) 228 and data latch C (CDL) 230. The XDL 224, ADL 226, BDL 228 and CDL 230 functions as intermediate data storage between memory controller 106 and memory 108. When instructed by host system 100 to write data to memory 108, memory controller 106 transfers data to XDL 224. The programming circuit 220 then writes the data from XDL 224 to the specified memory block and page. By way of example and without limitation, the size of the XDL 224, ADL 226, BDL 228 and CDL 230 is each equal to the size of an SLC memory page. Similarly, when instructed to read data from a specified memory page, reading circuit 218 reads data from the specified memory page into the XDL 224. Memory controller 106 then transfers the read data from the XDL 224 to controller RAM 204.

Generally writing data to an SLC memory block takes less time than writing the same amount of data to an MLC memory block. However, an MLC memory block has a higher density than an SLC memory block. To take advantage of the speed of SLC and the higher density of MLC, memory 108 may comprise both SLC memory blocks and MLC memory blocks, as is the case of the memory 108 illustrated in FIG. 2. Where memory 108 comprises both SLC memory blocks and MLC memory blocks, it may be desirable first to store data into an SLC memory page of an SLC memory block, 212 for example, and subsequently move the data to a MLC memory page, 216 for example. Moving data from SLC memory blocks to MLC memory blocks may be performed by processor 202 either as a background operation or when memory system 200 is idle (e.g., not being accessed by host system 100). The process of moving valid data from SLC memory blocks to one or more MLC memory block may be referred to as folding. Examples of folding are discussed in U.S. Patent Application Publication No. 2011/0153911 A1, which is incorporated by reference herein in its entirety. After data is transferred from the SLC memory pages, the SLC memory block may be erased and prepared to accept new data. Folding may also be performed on memory blocks. For example, data from three SLC memory blocks may be folded into a single 3-level MLC memory block. The memory pages of the SLC memory blocks may likewise be erased after the folding operation.

In an exemplary embodiment, after data is stored in three SLC memory pages, programming circuit 220 may move the data from the three SLC memory pages to a single 3 level MLC memory page. The movement may be effectuated by copying data from the first, second and third SLC memory page to the ADL 226, BDL 228 and CDL 230, respectively. As discussed above, the 3 level MLC is merely for illustration purposes only. For example, when using N level MLC, N data latches may be used to copy data from N SLC memory pages.

Typically, host system 100 may instruct memory system 102 to write data to a logical block. A logical block address (LBA) may be provided with the instruction to write data. Memory controller 106 may maintain a LBA to physical block table. The LBA may serve as an index into the LBA to physical block table. If data was previously stored at the LBA, the entry in the LBA to physical table corresponding to the LBA may include a reference to a memory block, 208-1 for example and a memory page, 212 for example, where the data was stored. If data was never stored to the LBA, the entry may be set to NULL. In response to receiving a request to write data, memory controller 106 may determine if data was previously stored to the LBA was previously written. If data was previously stored, memory controller 106 may mark the memory page associated with the LBA to indicate the data is obsolete. Memory controller 106 may identify an erased memory page in a memory block and store the received data to the identified memory page. The identified memory page may be an SLC memory page. Memory controller 106 may update the entry in the LBA to physical table corresponding to the LBA with a reference to the identity of the identified memory page and the memory block to which the identified memory page belongs. The memory page, 212 for example, containing the obsolete data may be erased when the memory block to which it belongs, 208-1 for example, is erased.

In another exemplary embodiment, before storing data received from host system 100 to an erased memory page, ECC engine 214 may compute an ECC for the data. An example ECC is the low-density parity-check code (LDPC). The calculated ECC may be stored along with the data. Separately, ECC engine 214 may compute the ECC for data in a memory page whenever the data read out from a memory page by memory controller 106. The memory controller 106 may read out the data from a memory page in response to receiving a request from host system 100. The ECC engine 214 may compare the computed ECC with the ECC that was stored in the memory page when the data was written to the memory page. Generally, if the number of bits in error or the bit error rate (BER) of the data of a memory page is below a threshold, the ECC engine 214 may utilize the ECC stored with the data to recover the bits in error.

Prior to erasing an SLC memory block, memory pages with valid data may be folded to erased memory pages of an MLC memory block, 210-1 for example. Entries in the LBA to physical table corresponding to SLC memory pages that were folded may be updated with references to the memory pages of the MLC memory block to which the data was folded. Folding valid data out of a memory block and erasing the memory block may be collectively referred to as recycling the memory block. Recycling a memory block makes it available to store new data.

Typically, after a number of erase cycles of a memory block, one or more of the memory cells in the memory block may lose their ability to store charge. When this happens, the memory block can no longer be used to store data. To prolong the life of a memory block and the memory device in general, memory controller 106 may implement wear leveling schemes.

In one exemplary wear leveling scheme, memory controller 106 may track the number of times each memory block is erased. Memory controller 106 may recycle the memory block that has been erased the fewest number of times. In another wear leveling scheme, memory controller 106 may move data from a memory block that has been erased a lesser number of times to a memory block that has been erased a greater number of times. However, actively tracking the number of erase cycles for each of the memory blocks adds processing overhead. In another exemplary embodiment, memory controller 106 may implement the passive wear leveling scheme described below.

Blocks in the memory 108 may be in different states. Examples of different states may be an unallocated state and an allocated state. In one embodiment, an unallocated block (e.g., a block in the unallocated state) may be used by the storage device 102 for allocation toward a specific purpose, such as to store host data or to store control data. Similarly, an allocated block (e.g., a block in the allocated state) has already been designated by the storage device 102 for allocation toward a specific purpose (e.g., the storage device 102 has previously designated the block to store host data or to store control data).

The storage device may perform certain one or more operations in order to place the block in the unallocated state or to place the block in the allocated state. In one embodiment, a respective block may be placed into the unallocated state by performing one or more operations so that the respective block is ready for data to be programmed into the respective block. For example, upon initial use, the storage device 102 may format blocks in order to prepare the blocks for programming of data, and thus place the blocks into the unallocated state. As discussed in more detail below, the formatting of the blocks (and in turn, the change in state associated with the block to allocated) may be performed in a certain order. In a specific example of a memory with 50 blocks (e.g., block 1, block 2, . . . , block 50), the storage device 102 may format the 50 blocks in a specific order, such as formatting block 1 first, block 2 second, and so on. In this way, the 50 blocks have a specific order in which each are placed in the unallocated state. As another example, the storage device 102 may perform one or more operations in order to change the state of the block, such as garbage collection on a block, in order to place an allocated block into an unallocated state. Garbage collection is a process by which to eliminate invalid or out-of-date data and to release storage locations. Garbage collection is merely one example in which an allocated block may be placed into an unallocated state.

Figure 3:
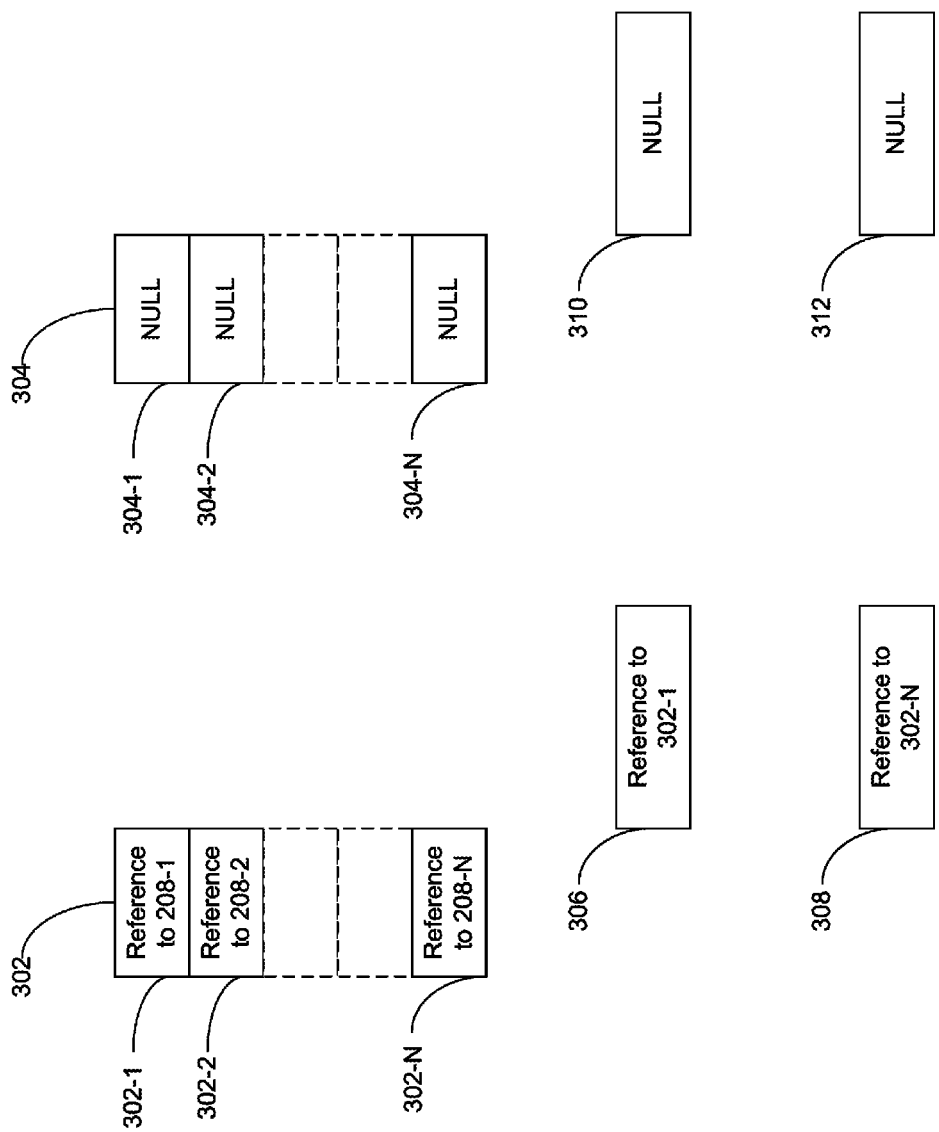
FIG. 3 illustrates the free and closed block first in first out (FIFOs) array after a format operation of the non-volatile memory.

Referring to FIG. 3, in an exemplary embodiment to implement a passive wear leveling scheme, memory controller 106 may maintain two lists, such as two first in first out arrays or simply FIFOs. The free block FIFO 302 may be used to store references to blocks that are available for writing data thereto, such as to erased SLC memory blocks or newly formatted SLC memory blocks. In this regard, an erased memory block or a formatted memory block may be referred to as a free memory block. In one embodiment, the closed block FIFO 304 may be used to store references to SLC memory blocks that have been allocated with data, such as SLC memory blocks with memory pages that store valid data and/or obsolete data. In a more specific embodiment, the closed block FIFO 304 may be used to store references to SLC memory blocks that has all the memory pages written and has no valid data, has partially valid data, or has fully valid data. In this regard, an SLC memory block that has been allocated to store data therein, such as valid and/or obsolete data stored therein, may be referred to as a closed memory block. Free block FIFO 302 and closed block FIFO 304 may be stored in one or more parts of the memory device, such as in controller RAM 206, in an embodiment. A FIFO is typically characterized by a head and a tail. Data is added to the tail of the FIFO and data is removed from the head of the FIFO. Thus, the data that first enters the FIFO is also the first data to leave the FIFO.

In this regard, in one embodiment, there is a single combination of a free block FIFO and a closed block FIFO. In an alternative embodiment, there are multiple free block FIFO and closed block FIFO combinations. For example, there may be a first free block FIFO and a first closed block FIFO for blocks assigned to store host data (e.g., data that was sent from the host for writing to memory 108) a second free block FIFO and a second closed block FIFO for blocks assigned to store internal management data.

After memory 108 is formatted by host system 100, all of the SLC memory blocks 208-1 to 208-N will be erased. Free block FIFO 302 may be populated with references to the erased memory blocks. For example, entry 302-1 may include a reference to SLC memory block 208-1, entry 302-2 may include a reference to SLC memory block 208-2 and entry 302-N may include a reference to SLC memory block 208-N. Thus, the initial listing of the blocks in the free block FIFO may be based on a physical layout of the blocks in memory 108. Alternatively, the initial listing of the blocks in the free block FIFO may be based on other criteria, such as a random selection of the blocks. In this regard, in one embodiment, the sequence of the initial listing in the free block FIFO is of lesser importance. Rather, it is of greater importance that the sequence be maintained, such as selection of blocks from the free block FIFO for writing.

Memory controller 106 may also maintain a free block head pointer 306 and a free block tail pointer 308. Free block head pointer 306 and a free block tail pointer 308 may be memory locations in controller RAM 206. Free block head pointer 306 may include a reference to the first entry of the free block FIFO 302 that includes a valid reference to a free memory block and free block tail pointer 306 may include a reference to the last entry of the free block FIFO 302 that includes a reference to a free memory block. Thus, the free block head pointer 306 points to the head of the free block FIFO 302 and the free block tail pointer 308 points to the tail of the free block FIFO 302. After a format operation, free block head pointer 306 includes a reference to entry 302-1 and free block tail pointer 308 includes a reference to entry 302-N.

After a format operation, all entries in the closed block FIFO 304 may be set to NULL because all of the SLC memory blocks 208-1 to 208-N are free and there are no closed blocks. Closed block head pointer 310 includes a reference to the first entry of the closed block FIFO 304 that includes a reference to a closed block. Closed block tail pointer 312 includes a reference to the last entry of the closed block FIFO 304 that includes a reference to a closed block. Because there are no closed blocks both closed block head pointer 310 and closed block tail pointer 312 are set to NULL.

In response to receiving a request to store data to an LBA, memory controller 106 may determine if there are closed memory blocks with erased memory pages. This may be accomplished by using references stored in the entries of the closed block FIFO 304. Because none of the entries in the closed block FIFO 304 point to a closed memory block, memory controller 106 may select a free memory block. In an exemplary embodiment, memory controller 106 may retrieve the reference to the entry of the free block FIFO 302 that is stored in the free block head pointer 306 i.e., 302-1.

Memory controller 106 may retrieve the reference to the memory block stored in entry 302-1 (i.e., 208-1).

Figure 4:
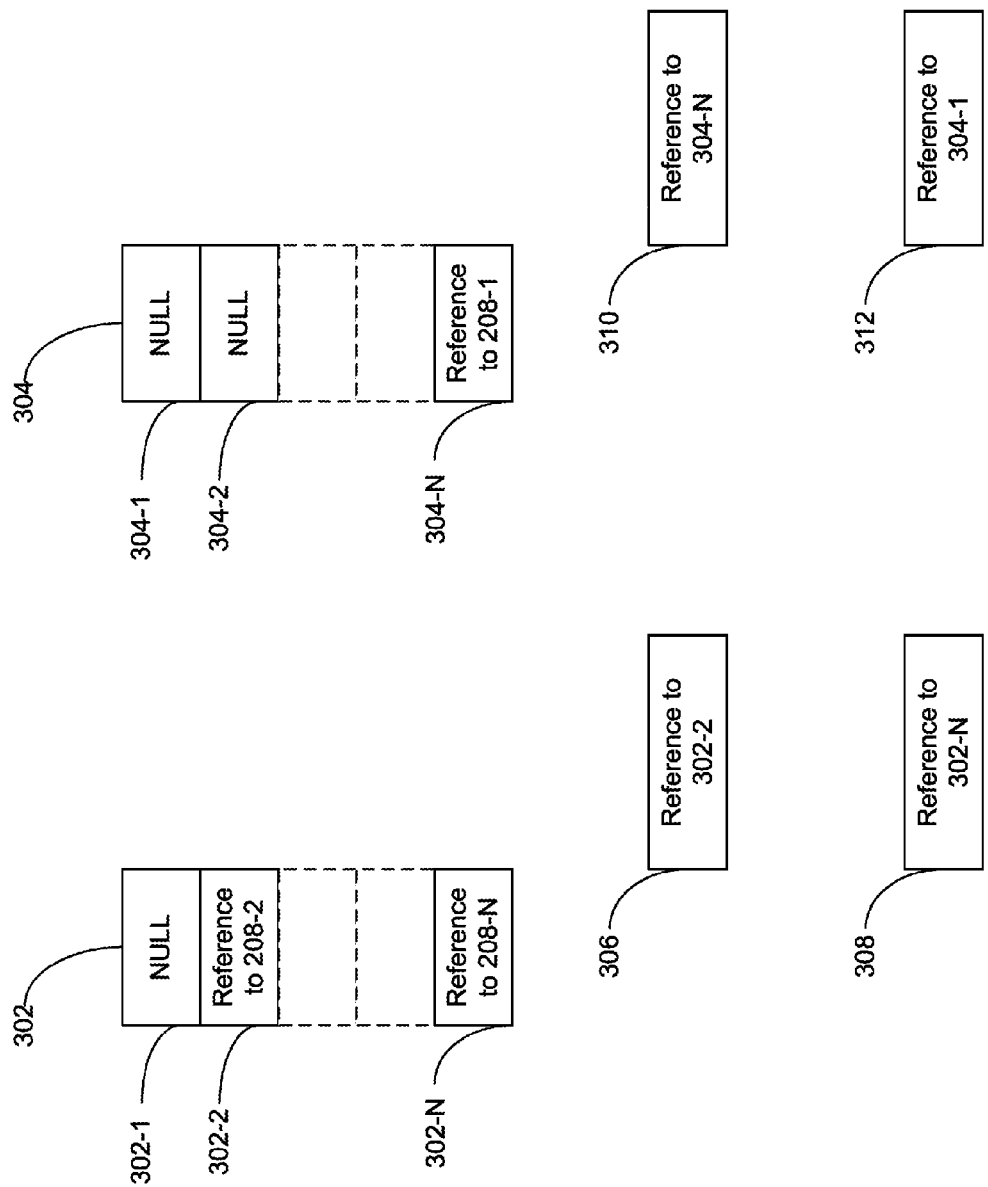
FIG. 4 illustrates the free and closed first in first out (FIFOs) array after allocation of a free memory block to the closed block FIFO.

Memory controller 106 may store the data received from host system 100 in an erased memory page, 212 for example, of memory block 208-1. Memory controller 106 may update the entry in the LBA to physical block table corresponding to the LBA with a reference to the memory page 212 and the memory block 208-1. Memory controller 106 may update the entry in the closed block FIFO 304 referenced by the closed block tail pointer 312 with a reference to memory block 208-1. Thus, closed block tail pointer 312 includes a reference to memory block 208-1. Memory controller 106 may change (e.g., increment) closed block head pointer 310 to point to the next entry in the closed block FIFO 304. Memory controller 106 may adjust the free block head pointer 306 to point to the next entry (i.e., 302-2) of the free block FIFO 302. Moving the reference of a free memory block from the free block FIFO 302 to the closed block FIFO 304 may be referred to as allocating a free memory block. FIG. 4 depicts the state of the open and closed block FIFOs 302 and 304 and the free block head and tail pointers 306 and 308 and closed block head and tail pointers 310 and 312.

Figure 5:
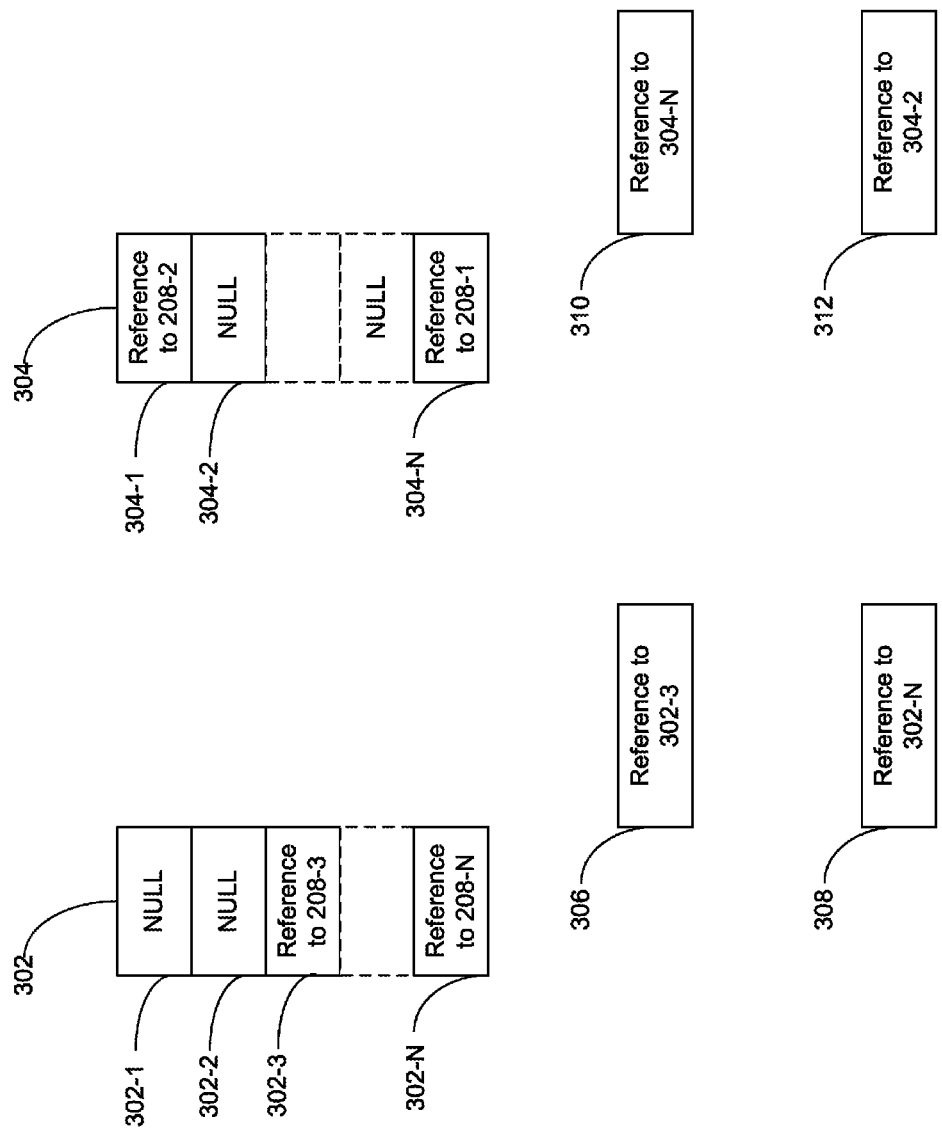
FIG. 5 illustrates the free and closed first in first out (FIFOs) array after allocation of a second free memory block to the closed block FIFO.

In response to subsequent requests to store data to LBAs, memory controller 106 may store data in the erased memory pages of closed memory block 208-1. When there are no more erased pages in the closed memory block 208-1, memory controller 106 may use the information stored in the free block head pointer 306 to allocate the next free memory block from the head of free block FIFO 302. A reference to the newly allocated free memory block may be added to the entry of the closed block FIFO 304 referenced by the closed block tail pointer 312. After addition of the reference to the newly allocated free memory block, closed block tail pointer 312 may be advanced. FIG. 5 depicts the state of the open and closed block FIFOs 302 and 304 and the free block head and tail pointers 306 and 308 and closed block head and tail pointers 310 and 312 after allocation of a second free memory block 208-2.

To recycle a closed memory page, memory controller 106 retrieves the reference stored in the closed block head pointer 310. This reference points to an entry in the closed block FIFO 304. This entry contains the reference to the first allocated free memory block, 208-1 for example. Memory controller 106 may fold valid data from memory pages of memory block 208-1 to memory pages of an MLC memory block 210-1 for example. After completion of folding, the memory block (such as memory block 208-1) may be erased, in an embodiment. In response to erasing the memory block, a reference to the erased memory block may be added to the tail entry of the free block FIFO 302. The process of removing a reference to a memory block from the closed block FIFO 304 and adding the reference to the free block FIFO 302 may be referred to as releasing the memory block to the free block FIFO 302. In another embodiment, the memory block may be erased. In this embodiment, the memory block may be erased when it is again allocated to the closed block FIFO 304. For example, upon erasing memory block 208-1, free block tail pointer 308 includes a reference to memory block 208-1. The tail entry may be identified using the data stored in the free block tail pointer 308. Separately, the reference to the erased memory block stored in the entry of the closed block FIFO 304 may be set to NULL and the reference stored in the closed block head pointer 310 may be decremented.

Thus, in one embodiment, the blocks selected for release (such as for garbage collection or folding) are not based at all on the amount of valid data in the block. In this regard, the blocks selected for garbage collection are independent of (or not dependent at all on) the amount of valid data in the block. Rather, the FIFOs, such as the free block FIFO and closed block FIFO, dictate the sequence of selections of blocks for garbage collection. Thus, a first block that is filled entirely with valid data is treated the same as a second block that is filled entirely with invalid data.

Thus wear leveling is achieved passively as an SLC memory block moves from the head of the free block FIFO 302 to the tail of the free block FIFO 302 by way of the closed block FIFO 304. Because the memory blocks get recycled in the order in which they were allocated, there is no difference in the erase counts for the memory blocks.

In another exemplary embodiment, a single FIFO may be utilized. In this embodiment, free block head pointer 308, free block tail pointer 310, closed block head pointer 312 and closed block tail pointer 314 may be adjusted to track the closed and free memory blocks.

Figure 6:
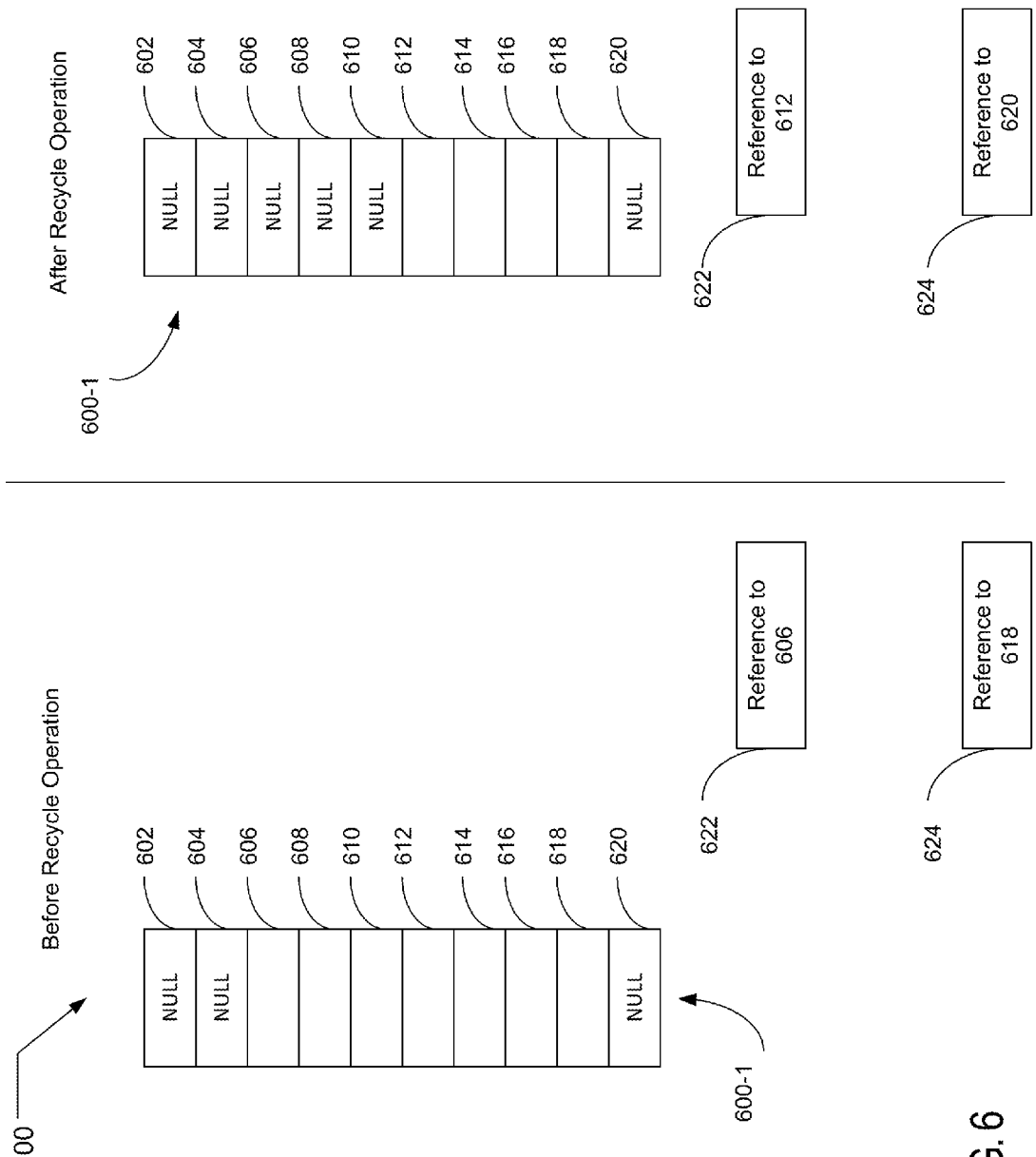
FIG. 6 illustrates an exemplary closed block FIFO before and after a recycle operation.

FIG. 6 illustrates an exemplary closed block FIFO 600 before 600-1 and after 600-2 a recycle operation. In one embodiment, a recycle operation comprises identifying a closed memory block, folding valid data out of the identified memory block (if any valid data is present) and moving a reference to the memory block to the tail of the open block FIFO. In this embodiment, identifying the closed memory block comprises retrieving a reference to a closed memory block from an entry of the closed block FIFO 600 pointed to by the reference stored in the closed block head pointer 622. Using the retrieved reference, the memory pages of the identified closed memory block may be examined. Memory pages with valid data may be folded to a MLC page. The reference to the memory block may be added to the end of an open block FIFO. In an embodiment, the memory block may be erased after the folding operation. The entry in the closed memory FIFO that references the memory block may be set to NULL.

In an embodiment, the ECC for the data stored in memory pages may be verified before the folding operation. If it is determined that one or memory pages have uncorrectable errors, after folding the memory pages with no errors, the reference to the memory block may be appended to the tail of the closed block FIFO 600.

In the exemplary scenario of FIG. 6, before 600-1 the recycle operation, closed loop FIFO 600 has seven entries 606-618 that include references to closed memory blocks. Closed block head pointer 622 includes a reference to entry 606. Closed block tail pointer 624 includes a reference to entry 618. After a recycle operation 600-2, three closed memory blocks are recycled. The references to the three closed memory blocks are retrieved from entries 606, 608 and 610 of the closed block FIFO 600. After the recycle operation, the reference stored in the closed block head pointer may be adjusted to point to entry 612.

Figure 7:
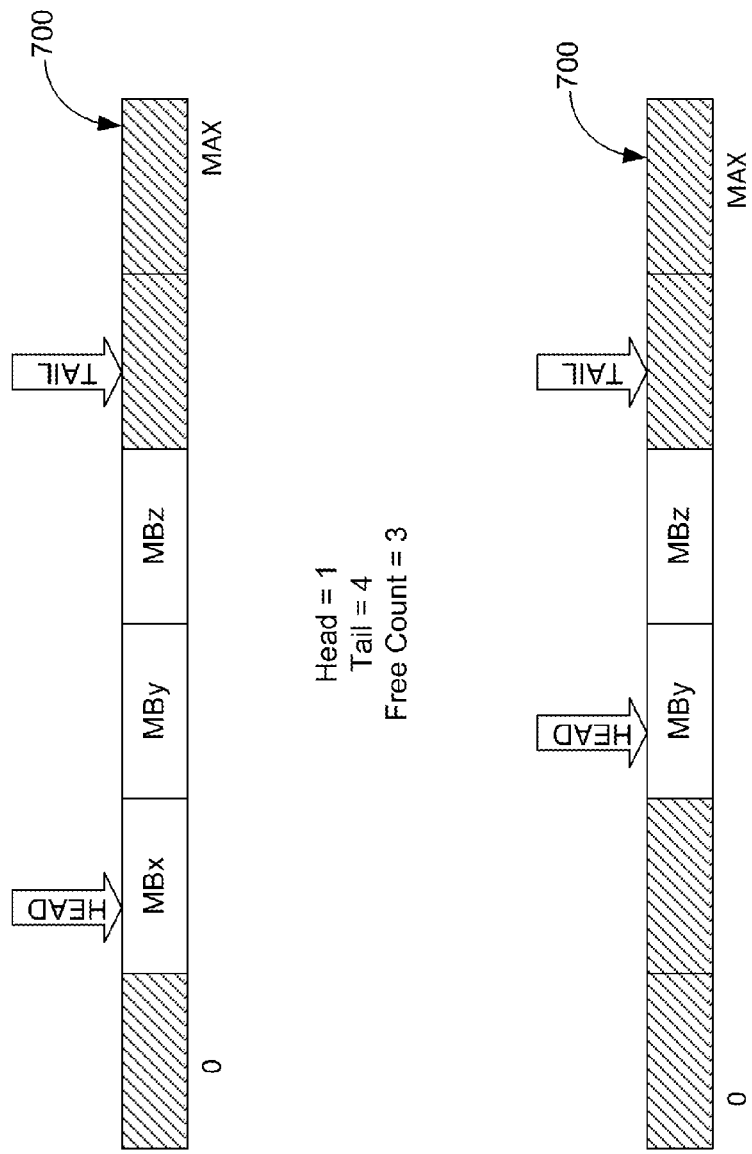
FIG. 7 illustrates an exemplary scenario of allocating a memory block from a free memory block FIFO.

FIG. 7 illustrates an exemplary scenario of allocating a memory block from a free memory block FIFO 700. As illustrated in FIG. 7, free memory block FIFO 700 comprises six entries for illustration purposes. Each of the entries may include an indication to each of blocks 0 to block MAX. Entries that do not include a reference to a free memory block are filled with lines. The free block head pointer points to the second entry of the free memory block FIFO 700 which includes a reference to memory block MBx. The free block tail pointer points to the fifth entry. As illustrated in FIG. 7, the total number of free memory blocks is 3.

In response to a request to allocate a free memory block, the free memory block stored in the entry referenced by the free block head pointer (i.e., MBx) is allocated and the free block head pointer is adjusted to point to the next entry of the free block FIFO 700.

Figure 8:
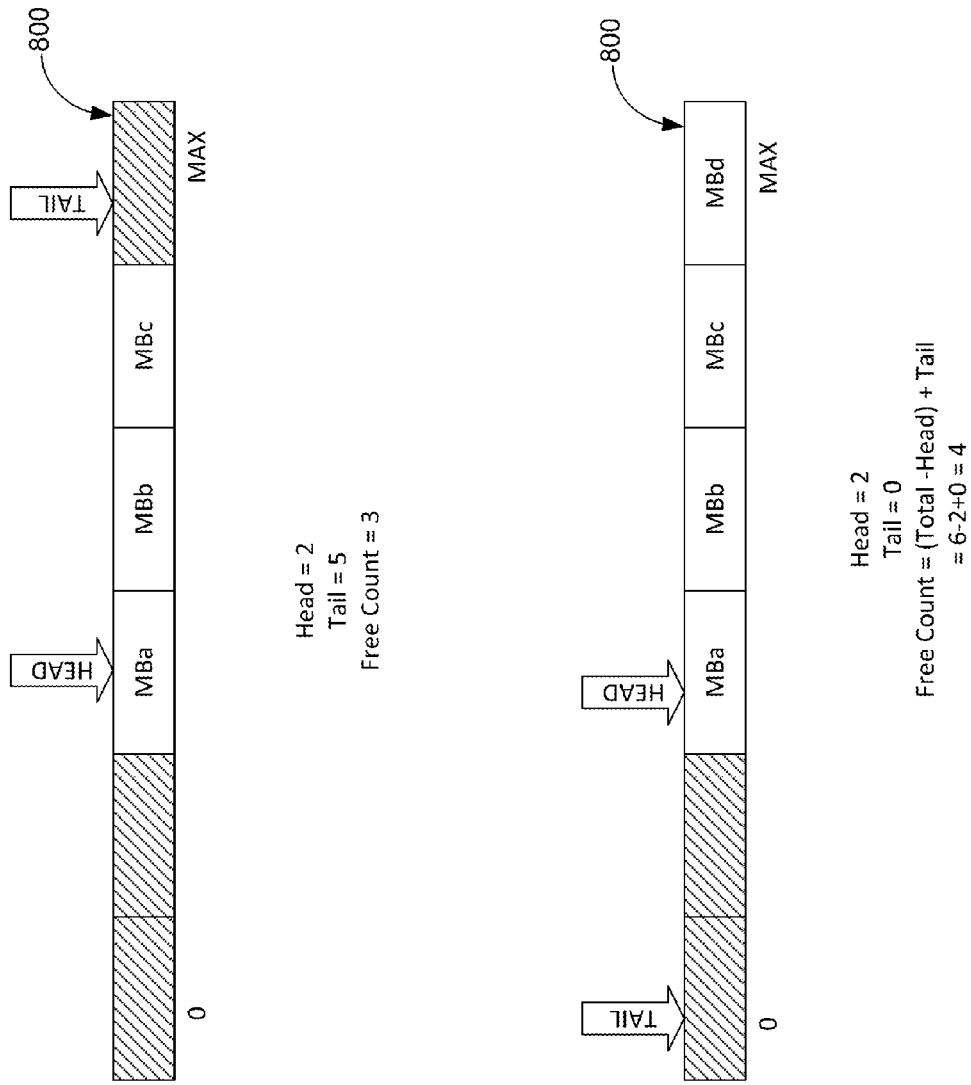
FIG. 8 illustrates an exemplary scenario of releasing a memory block to a free memory block FIFO from a closed block FIFO.

FIG. 8 illustrates an exemplary scenario of releasing a previously allocated memory block to a free memory block FIFO 800. Free memory block FIFO 800 comprises six entries. Entries that do not include a reference to a free memory block are filled with lines. The free block head pointer points to the third entry of the free memory block FIFO 700 which includes a reference to memory block MBa. The free block tail pointer points to the sixth entry. The total number of free memory blocks is 3.

In response to releasing a memory block MBd from a closed block FIFO, a reference to memory block MBd is stored in the entry of the free block FIFO pointed to by the free block tail pointer. The free block tail pointer thus wraps around to the first entry of the closed block FIFO.

Figure 9:
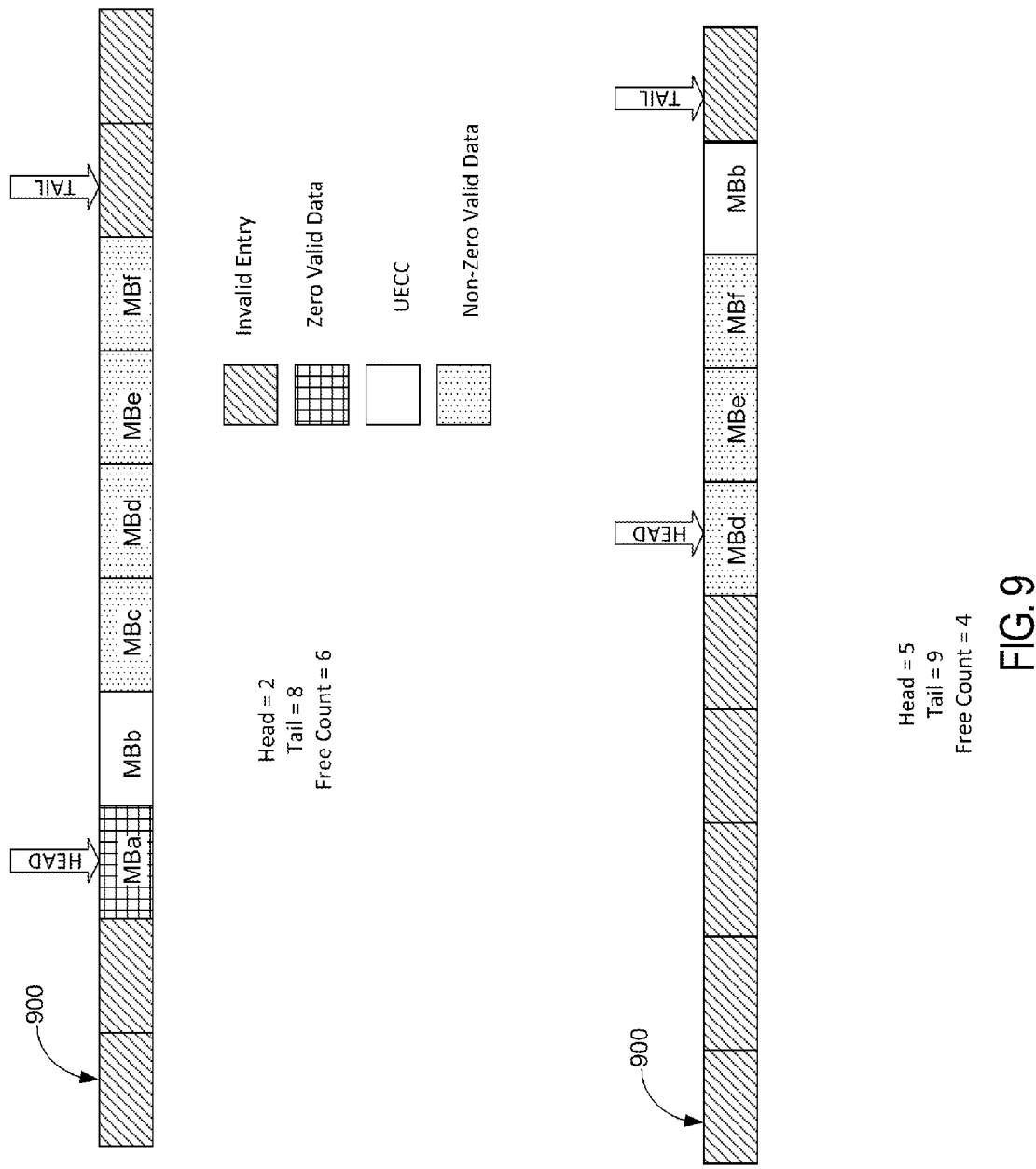
FIG. 9 illustrates an exemplary scenario of releasing a memory block from a closed block FIFO to a free memory block FIFO.

FIG. 9 depicts an exemplary scenario of releasing an allocated memory block from a closed memory block FIFO 900. Releasing an allocated memory block may be performed as a part of a garbage collection process. In the exemplary scenario, after garbage collection, two memory blocks MBa and MBc are released after folding the valid data to one or more MLC blocks. ECC engine 214 may determine that memory block MBb has uncorrectable errors and the reference to MBb is added to the tail of closed block FIFO 900. By moving the reference to a block with uncorrectable errors to the tail, the block is taken out of sequence. As shown, even though MBb has uncorrectable errors, the block is not taken out of sequence. Rather, in response to an instruction that the block with uncorrectable errors may be released, the block with uncorrectable errors may then be released in the sequence as shown.

The sequence (e.g., from block 0 to block MAX) of FIGS. 7 and 8 is an example of a sequence. This is the sequence used for allocation (and then subsequent release) of the memory blocks. The sequence is predetermined by the order in which the references to the free memory blocks are stored in the free block FIFO.

Thus, in one embodiment, the initial sequence as populated in the free block FIFO may remain the sequence at which the blocks are used henceforth in the memory device. In an example system of 20 blocks, the initial sequence in the free block FIFO may be as follows: block 1, block 7, block 3, block 6, block 13, block 10, block 20, block 12, block 11, block 2, block 14, block 19, block 5, block 18, block 4, block 15, block 8, block 9, block 16, block 17, with the head of the free block FIFO pointing to block 1 and the tail of the free block FIFO pointing to block 17. In this regard, free block FIFO and the closed block FIFO includes the following listings:

free block FIFO: blocks 1 (head), 7, 3, 6, 13, 10, 20, 12, 11, 2, 14, 19, 5, 18, 4, 15, 8, 9, 16, 17 (tail)

closed block FIFO: blocks null (head), null (tail)

When data is to be written, the controller 106 selects the blocks in the sequence as listed in the free block FIFO for writing data thereto, and then adds the written-to blocks in the closed block FIFO in the same sequence. In the example where two blocks are needed to store the host data, the head tail of the free block FIFO is used to select the first two blocks in the sequence (blocks 1 and 7). Further, the head of the free block FIFO is updated to point to block 3. Finally, the closed block FIFO is updated, adding blocks 1 and 7 to the end of the closed block FIFO, with the head of the closed block FIFO pointing to block 1 and with the tail of the closed block FIFO pointing to block 7. In this regard, free block FIFO and the closed block FIFO includes the following listings:

free block FIFO: blocks 3 (head), 6, 13, 10, 20, 12, 11, 2, 14, 19, 5, 18, 4, 15, 8, 9, 16, 17 (tail)

closed block FIFO: blocks 1 (head), 7 (tail)

After which, if an additional 5 blocks of host data is to be written, the controller: uses the head of the free block FIFO to select blocks 3, 6, 13, 10, 20; writes the host data into blocks 3, 6, 13, 10, 20; updates the head of the free block FIFO to point to block 12; adds blocks 3, 6, 13, 10, 20 to the end of the closed block FIFO; and updates the tail of the closed block FIFO to point to block 20. In this regard, free block FIFO and the closed block FIFO includes the following listings:

free block FIFO: blocks 12 (head), 11, 2, 14, 19, 5, 18, 4, 15, 8, 9, 16, 17 (tail)

closed block FIFO: blocks 1 (head), 7, 3, 6, 13, 10, 20 (tail)

When a release of blocks is to be performed, the controller 106 selects the blocks for release based on the sequence in the closed block FIFO. As discussed above, release of the blocks may include one of several actions including, without limitation, garbage collection, folding, or the like. For example, the controller may determine that two blocks need to be released. In this regard, the controller: uses the head of the closed block FIFO to select blocks 1 and 7 for release (e.g., garbage collection); garbage collects blocks 1 and 7; updates the head of the closed block FIFO to point to block 3; adds blocks 1 and 7 to the end of free block FIFO; and updates the tail of the free block FIFO to point to block 7. In this regard, free block FIFO and the closed block FIFO includes the following listings:

free block FIFO: blocks 12 (head), 11, 2, 14, 19, 5, 18, 4, 15, 8, 9, 16, 17, 1, 7 (tail)

closed block FIFO: blocks 3 (head), 6, 13, 10, 20 (tail)

This methodology may continue, so that the exact same sequence is used throughout the life of the memory device.

In an alternate embodiment, the initial sequence as populated in the free block FIFO will not remain the sequence at which the blocks are used henceforth in the memory device. In a more specific embodiment, one or more blocks may be taken out of the sequence for a different use. In one example, the initial sequence as populated in the free block FIFO may be for blocks assigned to writing host data. In particular, the host device, to which the storage device is connected, may send data to the storage device for storage therein. In this example, one or more blocks may be allocated for a different purpose other than writing host data, such as for internal management or movement of data within the storage device (e.g., garbage collection is merely one example of an internal copying of remaining valid data from a previously written block to a new block so that the previously written block may be recycled for later use). In the example above, the initial sequence of blocks is as follows: 1, 7, 3, 6, 13, 10, 20, 12, 11, 2, 14, 19, 5, 18, 4, 15, 8, 9, 16, 17. The usage of the blocks may cycle through this initial sequence until one or more of the blocks are removed. For example, block 5 may be allocated to another use, such as for storage device's internal management of data, thereby removing block 5. In this regard, a first updated sequence may be as follows: 1, 7, 3, 6, 13, 10, 20, 12, 11, 2, 14, 19, 18, 4, 15, 8, 9, 16, 17. After which, the usage of the blocks may cycle through the first updated sequence until one or more of the blocks are removed or until block 5 is added back for use in host writes.

In particular, after block 5 is removed, another block, such as block 13 may be removed, resulting in yet a second updated sequence of 1, 7, 3, 6, 10, 20, 12, 11, 2, 14, 19, 18, 4, 15, 8, 9, 16, 17. After which, in one embodiment, the removed block *such as block 5) may be reallocated again for host writes, resulting in the reintroduction of block 5.

The block (such as block 5) may be reintroduced into the sequence in one of several ways. In one embodiment, block 5 may be reintroduced such that it is placed in the same where it was previously. In the example given above, block 5 was between block 19 and block 18. In this regard, when reintroducing block 5, blocks 19 and 18 may first be located, either within the free block FIFO or the closed block FIFO, and reinserted there between. For example, if the head of the closed block FIFO is pointing to block 19 (and block 18 is next in the sequence in the closed block FIFO), block 5 may be reinserted right after block 19 (so that block 5 is next in the sequence in the closed block FIFO after block 19, and block 18 is right after block 5 after reinsertion). In an alternate embodiment, the block may be into the sequence based on the timing of the reintroduction. In a more particular embodiment, the block may be "freed" for use to write host data. In this regard, the block may be added to the free block FIFO. In one embodiment, when the block is reintroduced, it may be added to the end of the free block FIFO. So that, the reintroduced block may be inserted in the sequence based on when the block is reintroduced for use as a block to write host data.

As discussed above, the sequence may be altered in the scenario where one or more of the memory blocks include ECC errors or other permanent failures, in which case these blocks are taken out of the sequence. For example, the free block FIFO and the closed block FIFO may include the following listings:

free block FIFO: blocks 12 (head), 11, 2, 14, 19, 5, 18, 4, 15, 8, 9, 16, 17, 1, 7 (tail)

closed block FIFO: blocks 3 (head), 6, 13, 10, 20 (tail)

In the event that one block is needed to be released and in the event that block 3 includes data that is uncorrectable, the controller: uses the head of the closed block FIFO to select block 3; determines that block 3 includes UECC; determines, because block 3 is uncorrectable, not to release block 3; moves block 3 to the tail; selects block 6 to be released; moves block 6 to the tail of the free block FIFO; and updates the head of the closed block FIFO to point to block 13. In this regard, free block FIFO and the closed block FIFO includes the following listings:

free block FIFO: blocks 12 (head), 11, 2 14, 19, 5, 18, 4, 15, 8, 9, 16, 17, 1, 7, 6 (tail)

closed block FIFO: blocks 13 (head), 10, 20, 12, 11, 3 (tail)

In this way, the sequence is continued; however, the block with UECC is not written to. This sequence is continued until it is determined that the UECC block is released. For example, the host system may instruct that the UECC block is released. In one embodiment, in response to an instruction to release the UECC block, the controller may erase the UECC block when the head of the closed block FIFO points to the UECC block.

In an embodiment, the afore-described passive wear leveling scheme may be implemented by a memory controller 106 that includes a free block FIFO management module, a closed block FIFO management module, and folding module may be included in the system controller. The free block FIFO management module may manage the free block FIFO, the free block head pointer and tail pointer. The free block FIFO management module may also manage the allocation of a memory block. The closed block FIFO management module may manage the close block FIFO, the closed block head pointer and tail pointer. The closed block FIFO management module may also manage the release of a memory block from the closed block FIFO to the free block FIFO. The folding module may perform the steps of verifying the ECC of the data stored in allocated memory blocks and the folding of valid data to an MLC block before release from the closed block FIFO. In an embodiment, the folding module may erase a memory block after folding and prior to release.

In an alternate embodiment, the afore-described passive wear leveling scheme may be implemented by a memory controller 106 that includes a storage module configured to store data in the blocks of the memory in a sequence; a release determination module configured to determine whether to release one or more blocks in the memory; a block selection module configured to, in response to determining to release one or more blocks, select blocks for release based, at least in part, on the sequence in which the data was stored in the blocks; and a release module configured to release the selected blocks. The release module may be configured to release the one or more blocks, such as by garbage collection or folding.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

Further embodiments can be envisioned by one of ordinary skill in the art after reading the foregoing. In other embodiments, combinations or sub-combinations of the above disclosed invention can be advantageously made. The block diagrams of the architecture and flow diagrams are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

We claim:

1. A method for selecting blocks in a memory of a memory device for release, the method comprising:
   using a processor:
   receiving host data from a host;
   in response to receiving the host data, storing the host data in the blocks of the memory in a sequence, the sequence indicative of an order in which the blocks of the memory have the host data stored therein, wherein storing the host data in the blocks of the memory in the sequence comprises:
   accessing a free block FIFO, the free block FIFO comprising a series of references indicative of series of unallocated memory blocks;
   using the series of references from the free block FIFO in order to select a block for storing the host data therein; and
   updating a closed block FIFO with a reference to the selected block in which the host data is stored therein, the closed block FIFO comprising a series of references indicative of allocated memory blocks, wherein the series of references is based on the sequence by which the host data is stored in the blocks of the memory;
   determining to release one or more blocks in the memory;
   in response to determining to release one or more blocks, selecting blocks for release based, at least in part, on the sequence in which the host data was stored in the blocks; and
   performing block release on the selected blocks.

2. The method of claim 1, wherein the sequence in which the host data is stored in the blocks is based on a previous sequence of selecting blocks for release.

3. The method of claim 1, wherein selecting blocks for release based, at least in part, on the sequence in which the host data was stored in the blocks comprises accessing the closed block FIFO.

4. The method of claim 3, wherein the free block FIFO comprises a head that points to a first in the series of references indicative of a first block in the series of unallocated memory blocks and a tail that points to a last in the series of references indicative of a last block in the series of unallocated memory blocks; and
   wherein the host data is first stored in the first block, to which the head of the free block FIFO is pointing.

5. The method of claim 4, wherein the closed block FIFO comprises a head that points to a first in the series of references indicative of a first block in the series of allocated memory blocks and a tail that points to a last in the series of references indicative of a last block in the series of allocated memory blocks; and
   wherein the block release is first performed on the first block, to which the head of the closed block FIFO is pointing.

6. The method of claim 5, wherein the series of references indicative of the series of unallocated memory blocks comprises the sequence by which blocks were released.

7. The method of claim 6, wherein the series of references indicative of the series of allocated memory blocks comprises the sequence by which blocks were selected for storage of host data therein.

8. The method of claim 5, further comprising:
   determining whether a block selected from the closed block FIFO for release includes uncorrectable data;
   in response to determining that the block selected for release includes uncorrectable data:
   determining not to release the block; and
   pointing the tail of the closed block FIFO to the reference to the block.

9. A method for selecting blocks in a memory of a memory device for release, the method comprising:
   using a processor:
   receiving host data from a host;
   in response to receiving the host data, storing the host data in the blocks of the memory in a sequence, wherein storing the host data in the blocks of the memory in the sequence comprises:
   accessing a free block FIFO, the free block FIFO comprising a series of references indicative of series of unallocated memory blocks;
   using the series of references from the free block FIFO in order to select a block for storing the host data therein; and
   updating a closed block FIFO with a reference to the selected block in which the host data is stored therein, the closed block FIFO comprising a series of references indicative of allocated memory blocks, wherein the series of references is based on the sequence by which the host data is stored in the blocks of the memory;
   determining to release one or more blocks in the memory;

in response to determining to release one or more blocks, selecting blocks for release based, at least in part, on the sequence in which the host data was stored in the blocks; and performing block release on the selected blocks, wherein performing block release comprises performing garbage collection in which only valid data is copied from the blocks selected for garbage collection and in which the blocks selected for garbage collection are erased; and wherein selecting the blocks for garbage collection is independent of or not dependent on an amount of the valid data in the blocks.

10. The method of claim 9, wherein performing block release comprises folding data from SLC to MLC.

11. A method for selecting blocks in a memory of a memory device for unallocation, the method comprising:

using a processor:

determining to store data in one or more unallocated blocks of memory;

accessing a free block FIFO, the free block FIFO comprising a series of references indicative of series of unallocated memory blocks;

selecting unallocated blocks in which to store the data using the series of references in the free block FIFO;

updating a closed block FIFO with a reference to the selected unallocated blocks, the closed block FIFO comprising a series of references indicative of allocated memory blocks, wherein the series of references in the closed block FIFO is based on the series of references in the free block FIFO;

determining to unallocate one or more allocated blocks of memory;

accessing the closed block FIFO;

selecting allocated blocks for an unallocation process using the series of references in the closed block FIFO; and performing the unallocation process on the selected allocated blocks in order to unallocate the selected allocated blocks.

12. The method of claim 11, wherein the unallocation process comprises garbage collection.

13. The method of claim 11, wherein selecting unallocated blocks in which to store the data based on the series of references in the free block FIFO comprises first selecting the block to which a beginning of the series of references points;

in response to storing the data into the block to which the beginning of the series of references points, further comprising:

removing the reference in the free block FIFO to the block to which a beginning of the series of references points; and adding a reference in the closed block FIFO to an end of the series of references indicative of the series of allocated memory blocks.

14. The method of claim 13, in response to performing the unallocation process on the selected allocated blocks in order to unallocate the selected allocated blocks, further comprising:

removing the reference in the closed block FIFO to the selected allocated blocks; and adding references in the free block FIFO to an end of the series of references indicative of the series of unallocated memory blocks.

15. A storage device comprising:

a memory comprising blocks;

a storage module configured to store data in the blocks of the memory in a sequence, wherein the storage module is configured to:

access a free block FIFO, the free block FIFO comprising a series of references indicative of series of unallocated memory blocks; and use the series of references from the free block FIFO in order to select a block for storing host data therein;

a release determination module configured to determine whether to release one or more blocks in the memory;

a block selection module configured to, in response to determining to release one or more blocks, select blocks for release based, at least in part, on a closed block FIFO, the closed block FIFO comprising a series of references indicative of allocated memory blocks, wherein the series of references is based on the sequence by which the data is stored in the blocks of the memory; and a release module configured to release the selected blocks.

16. The storage device of claim 15, wherein the release module is configured to perform garbage collection by copying only valid data from the blocks selected for garbage collection to erased blocks and erasing the blocks selected for garbage collection; and wherein the block selection module is configured to select the blocks for garbage collection independently of an amount of the valid data in the blocks.

17. The storage device of claim 15, wherein the free block FIFO comprises a head that points to a first in the series of references indicative of a first block in a series of released memory blocks and a tail that points to a last in the series of references indicative of a last block in the series of released memory blocks; and wherein the storage module is configured to first store the data in the first block, to which the head of the free block FIFO is pointing.

18. The storage device of claim 17, wherein the closed block FIFO comprises a head that points to a first in the series of references indicative of a first block in the series of allocated memory blocks and a tail that points to a last in the series of references indicative of a last block in the series of allocated memory blocks; and wherein the release module is configured to first release the first block, to which the head of the closed block FIFO is pointing.

19. The storage device of claim 17, wherein the blocks referenced in the free block FIFO and the closed block FIFO consist of blocks for storing host data; and further comprising:

a block reassignment module configured to reassign a particular block from storage for host data to storage for internal management data; and block removal module configured, in response to the block reassignment module reassigning the particular block from storage for host data to storage for internal management data, removal of the reference to the particular block from one of the free block FIFO or the closed block FIFO.

* * * * *